(12) United States Patent
Weis et al.

(10) Patent No.: US 12,281,435 B2
(45) Date of Patent: *Apr. 22, 2025

(54) METHOD OF COATING ONTO FABRIC SUBSTRATES BY MEANS OF PLASMA

(71) Applicant: AGC GLASS EUROPE, Louvain-la-Neuve (BE)

(72) Inventors: Hansjoerg Weis, Höxter (DE); Jérôme Jolibois, Gosselies (BE)

(73) Assignee: AGC GLASS EUROPE, Louvain-la-Neuve (BE)

( * ) Notice: Subject to any disclaimer, the term of this patent is extended or adjusted under 35 U.S.C. 154(b) by 0 days.

This patent is subject to a terminal disclaimer.

(21) Appl. No.: 18/264,702

(22) PCT Filed: Feb. 7, 2022

(86) PCT No.: PCT/EP2022/052914
§ 371 (c)(1),
(2) Date: Aug. 8, 2023

(87) PCT Pub. No.: WO2022/171583
PCT Pub. Date: Aug. 18, 2022

(65) Prior Publication Data
US 2024/0117563 A1   Apr. 11, 2024

(30) Foreign Application Priority Data
Feb. 12, 2021 (EP) ..................... 21156951

(51) Int. Cl.
*C23C 16/02* (2006.01)
*C23C 16/04* (2006.01)
(Continued)

(52) U.S. Cl.
CPC .......... *D06N 3/0084* (2013.01); *C23C 16/02* (2013.01); *C23C 16/045* (2013.01);
(Continued)

(58) Field of Classification Search
CPC ...... C23C 16/02; C23C 16/045; C23C 16/503
See application file for complete search history.

(56) References Cited

U.S. PATENT DOCUMENTS

| 3,928,703 A | * | 12/1975 | Cook | ........................ C08J 5/043 |
| | | | | 427/375 |
| 6,146,462 A | | 11/2000 | Yializis et al. | |

(Continued)

FOREIGN PATENT DOCUMENTS

| EP | 1570917 A1 * | 9/2005 | ............... B05D 5/08 |
| WO | WO 99/58755 A1 | 11/1999 | |

(Continued)

OTHER PUBLICATIONS

Jongprateep, Oratai, et al., "Titanium dioxide and fluoropolymer-based coating for smart fabrics with antimicrobial and water repellent properties". RSC Adv., 2022, 12, 588-594.*

(Continued)

*Primary Examiner* — Bret P Chen
(74) *Attorney, Agent, or Firm* — Oblon, McClelland, Maier & Neustadt, L.L.P.

(57) ABSTRACT

A process for producing a fluorinated polymer coating on a fabric substrate, including providing a first plasma source containing at least one pair of hollow-cathode plasma generating electrodes, injecting a first plasma generating gas in the at least one pair of hollow-cathode plasma generating electrodes, applying a first electrical power to the first plasma source, injecting a fluorinated monomer with an inert carrier gas between the at least one pair of hollow-cathode plasma generating electrodes, and depositing the fluorinated polymer coating on a surface of the fabric substrate by exposing the fabric substrate to the plasma of the first plasma source. The fluorinated polymer coating is water repellent.

16 Claims, 2 Drawing Sheets

(51) Int. Cl.
    *C23C 16/503*     (2006.01)
    *D06M 10/02*     (2006.01)
    *D06M 10/10*     (2006.01)
    *D06M 15/277*     (2006.01)
    *D06N 3/00*     (2006.01)
    *D06N 3/04*     (2006.01)
    *D06M 101/32*     (2006.01)

(52) U.S. Cl.
    CPC ......... *C23C 16/503* (2013.01); *D06M 10/025* (2013.01); *D06M 10/10* (2013.01); *D06M 15/277* (2013.01); *D06N 3/0011* (2013.01); *D06N 3/0086* (2013.01); *D06N 3/047* (2013.01); *D06M 2101/32* (2013.01); *D06M 2200/12* (2013.01); *D06N 2201/02* (2013.01); *D06N 2207/14* (2013.01); *D06N 2209/142* (2013.01)

(56) References Cited

U.S. PATENT DOCUMENTS

| | | | |
|---|---|---|---|
| 2008/0107822 A1* | 5/2008 | Selwyn | D21H 23/44 427/535 |
| 2009/0200948 A1 | 8/2009 | Selwyn | |
| 2010/0028238 A1 | 2/2010 | Maschwitz | |
| 2013/0134878 A1 | 5/2013 | Selwyn | |
| 2013/0183488 A1* | 7/2013 | Liao | B32B 27/304 428/141 |
| 2013/0337250 A1* | 12/2013 | Austin | D06N 3/047 428/354 |
| 2014/0154399 A1* | 6/2014 | Weikart | C23C 16/50 427/2.3 |
| 2014/0216343 A1 | 8/2014 | Maschwitz | |
| 2014/0220361 A1 | 8/2014 | Maschwitz | |
| 2015/0002021 A1 | 1/2015 | Maschwitz | |
| 2015/0004330 A1 | 1/2015 | Maschwitz | |
| 2015/0255252 A1 | 9/2015 | Rogge et al. | |
| 2016/0186321 A1 | 6/2016 | Selwyn et al. | |
| 2017/0142962 A1* | 5/2017 | Tsai | C02F 1/4608 |
| 2024/0279811 A1* | 8/2024 | Arnoult | D06M 10/10 |

FOREIGN PATENT DOCUMENTS

| | | |
|---|---|---|
| WO | WO 99/59185 A1 | 11/1999 |
| WO | WO 2005/028741 A1 | 3/2005 |
| WO | WO 2008/057759 A2 | 5/2008 |
| WO | WO 2009/102603 A1 | 8/2009 |
| WO | WO 2010/017185 A1 | 2/2010 |
| WO | WO 2014/056968 A1 | 4/2014 |

OTHER PUBLICATIONS

Leroux, F., et al., "Fluorocarbon nano-coating of polyester fabrics by atmospheric air plasma with aerosol". Applied Surface Science 254 (2008) 3902-3908.*

Satulu, Veronica, et al., "Plasma Processing with Fluorine Chemistry for Modification of Surfaces Wettability". Molecules 2016, 21, 1711, pp. 1-15.*

Maity, Jayanta, "Coating of Fluorinated Polymer on the Surface of Cotton Fabrics-OFPM System". International Journal of Applied Science and Mathematics, vol. 2, Issue 4, pp. 2394-2894.*

Lin, Jing, et al., "Durably Antibacterial and Bacterially Antiadhesive Cotton Fabrics Coated by Cationic Fluorinated Polymers". ACS Applied Materials & Interfaces 2018 10 (7), 6124-6136.*

International Search Report Issued Jun. 29, 2022, in PCT/EP2022/052914, filed on Feb. 7, 2022, 4 pages.

* cited by examiner

METHOD OF COATING ONTO FABRIC SUBSTRATES BY MEANS OF PLASMA

CROSS REFERENCE TO RELATED APPLICATIONS

This application is a National Stage entry under 35 U.S.C. § 371 of PCT/EP2022/052914, filed on Feb. 7, 2022, and claims priority to European Patent Application No. EP 21156951.2, filed Feb. 12, 2021. The entire contents of both are incorporated herein by reference.

TECHNICAL FIELD

The present invention relates to methods for applying fluorinated polymer surface coatings onto fabric substrates. The fluorinated polymer coatings may provide the fabric substrates with water and/or oil repellency and preferably durable repellency properties. The fabric substrates may in particular be temperature sensitive.

The words fabric or fabrics as used in this application includes materials that are not woven as well as woven or knitted textiles, which may be manufactured into articles such as items of apparel for application in daily use, in industrial environments, in personal protective equipment (PPE), in sport and leisure environments and so on. Other articles into which fabrics may be manufactured as well are commodities, such as backpacks, umbrellas, tents, blinds, screens, canopies, tapestry, household textiles, sleeping bags etc. Fabrics are also utilized as filtration media articles for use, for example, in heating, ventilation or air conditioning (HVAC) systems or for use in exhaust filters, diesel filters, liquid filters, filtration media for medical applications and so on. Frequently, in HVAC applications, fabrics are not woven, knitted or otherwise formed into materials with a regular fiber structure or regular arrangement of the fibers. The methods and processes of this invention are applicable to all such fabrics.

It is known to coat fabric substrates with coatings, e.g. fluorinated polymer coatings, for the purpose of protecting the fabric substrate, for providing water repellency and or oil repellency.

WO2014056968A1 discloses low pressure plasma polymerization process to apply a fluorinated polymer nano-coating to a fabric substrate. This plasma polymerization process creates a plasma in the whole vacuum chamber comprising a plurality of specifically arranged electrode layers and is therefore slow and difficult to combine with other surface treatment and/or in a continuous process. By creating a plasma in a large volume it is also wasteful in the use of polymer precursors, which is particularly problematic given the environmental concerns related to fluorinated compounds.

There is therefore a need in the art to provide a process for coating fabric substrates with fluorinated polymers that is efficient and can be combined with other surface treatment and/or integrated in a continuous process.

SUMMARY OF INVENTION

It is an objective of present invention provides a solution to the problem of providing, fluorinated polymer coatings for fabric substrates, having adequate water and/or oil repellency.

It is an additional objective of the present invention provides a process that is rapid and efficient in that it completes the coating process in a very short amount of time and uses limited amounts of polymer precursor.

The present invention solves the abovementioned technical problems by providing a method for depositing a fluorinated polymer coating onto a fabric substrate by means of a low pressure hollow cathode plasma polymerization process with an fluorinated monomer.

The low-pressure hollow cathode plasma polymerization process of the present invention is particularly efficient in that it provides the plasma in a limited space directly over the fabric substrate, thereby limiting precursor usage, and is able to do so in addition without heating the fabric substrate to a degree that would require cooling of the fabric substrate.

BRIEF DESCRIPTION OF DRAWINGS

These and further aspects of the invention will be explained in greater detail by way of example and with reference to the accompanying drawings in which.

The figures are not drawn to scale.

DETAILED EMBODIMENTS

The invention relates to a process for the production of fluorinated polymer coating on fabric substrates comprising the stages consisting in:
a. providing a fabric substrate;
b. providing a first plasma source, of linear hollow-cathode type, comprising at least one pair of hollow-cathode plasma generating electrodes connected to an AC, DC or pulsed DC generator, for the deposition of said fluorinated polymer coating on the fabric substrate;
c. injecting a first plasma generating gas in the first plasma source's electrodes at a flow rate of between 500 and 2500 sccm per linear meter of plasma of the first plasma source;
d. applying a first electrical power to the first plasma source, so that the first power density of the plasma is between 0.5 kW and 15 kW per linear meter of plasma of the first plasma source;
e. injecting a fluorinated monomer at a flow rate of between 20 and 1000 sccm per linear meter of plasma of the first plasma source, the fluorinated monomer being injected into the plasma in at least between the electrodes of each electrode pair of the first plasma source, with an inert carrier gas at a flow rate of 0 and 1000 sccm per linear meter of plasma of the first plasma source;
f. depositing a fluorinated polymer coating on the fabric substrate's surface by exposing the fabric substrate to the plasma of the first plasma source.

The first plasma source deposits the fluorinated polymer coating on the fabric substrate.

The inventors have found that, by the use of the process, it is possible to obtain fluorinated coatings on a variety of fabric substrates. The resulting substrates show high water repellency and/or oil repellency.

Figure 1:
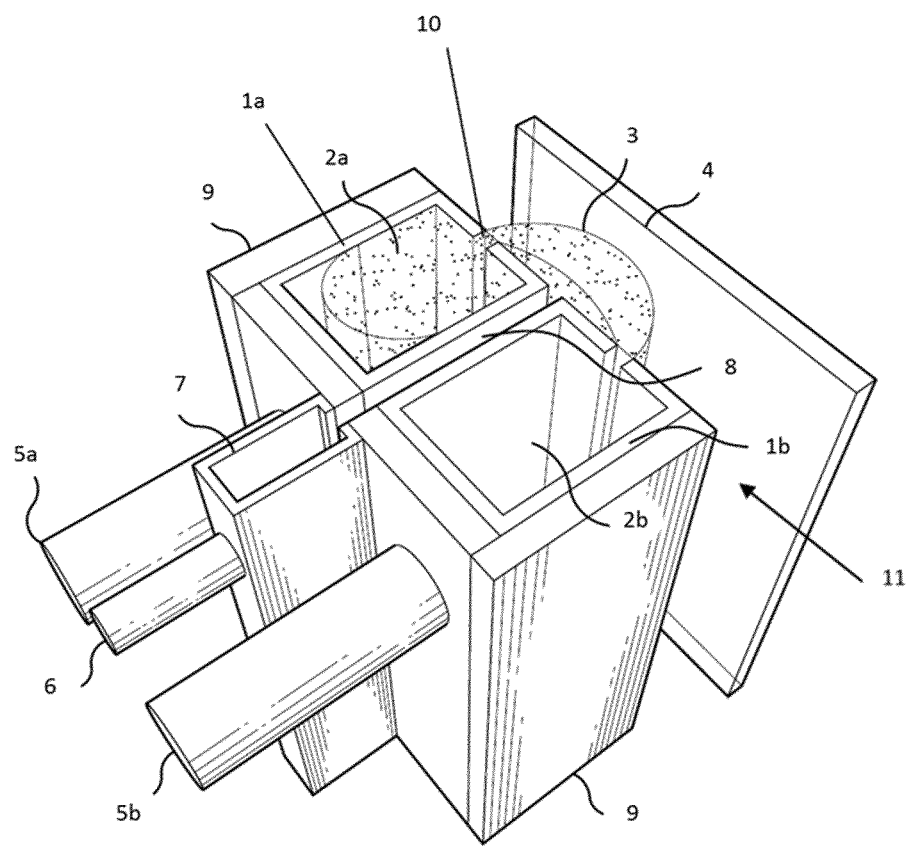
FIG. 1, shows a schematic cross section of a plasma source, of hollow cathode type for use in the present invention which contains one pair of electrodes.

"Plasma source of hollow cathode type," is taken to mean a plasma or ion source comprising one or more electrodes configured to produce hollow cathode discharges. One example of a hollow cathode plasma source is described in U.S. Pat. No. 8,652,586 to Maschwitz, incorporated herein by reference in its entirety. FIG. 1 shows a plasma source of hollow cathode type that may be used in the present invention. The first and second plasma sources each comprises at least one pair of hollow cathode electrodes (1a) and (1b), arranged in parallel and connected via an AC power source (not shown). Electrically insulating material (9) is disposed around the hollow cathode electrodes. The plasma generating gas is supplied via the inlets (5a) and (5b). When used, the precursor gas is supplied via the precursor gas inlet (6) and led through manifold (7) and precursor injection slot (8) in the dark space between the electrodes, into the plasma curtain 3. The AC power source supplies a varying or alternating bipolar voltage to the two electrodes. The AC power supply initially drives the first electrode to a negative voltage, allowing plasma formation, while the second electrode is driven to a positive voltage in order to serve as an anode for the voltage application circuit. This then drives the first electrode to a positive voltage and reverses the roles of cathode and anode. As one of the electrodes is driven negative (1a), a discharge (2a) forms within the corresponding cavity. The other electrode then forms an anode, causing electrons to escape the plasma through the outlet (10) and travel to the anodic side, thereby completing an electric circuit. A plasma having a curtain shape (3) is thus formed in the region between the first and the second electrodes above the fabric substrate (4). Substrate (4) is presently illustrated as a single sheet of substrate, it may however also be in the shape of a long ribbon, for instance in a roll-to-roll type coating device. This method of driving hollow cathodes with AC power contributes formation of a uniform linear plasma that spans across the fabric substrate, perpendicular to the travelling direction (11) of the fabric substrate. For the purpose of the present patent, the electron emitting surfaces may also be called plasma generating surfaces.

The linear hollow cathode type plasma sources of the present invention provide a linear plasma and are arranged perpendicularly to the travelling direction of the fabric substrate. Generally these plasma sources span perpendicularly over the width of the fabric substrate, providing a linear plasma curtain over the width of the fabric substrate, as opposed to punctual sources or shower head sources. Obviously, instead of a single substrate, substrate carriers carrying an array of substrates may be used.

"Closed circuit electron drift" is taken to mean an electron current caused by crossed electric and magnetic fields. In many conventional plasma forming devices the closed circuit electron drift forms a closed circulating path or "racetrack" of electron flow.

"AC power" is taken to mean electric power from an alternating source wherein the voltage is changing at some frequency in a manner that is sinusoidal, square wave, pulsed or some other waveform. Voltage variations are often from negative to positive, i.e. with respect to ground. When in bipolar form, power output delivered by two leads is generally about 180° out of phase.

"Electrodes" provide free electrons during the generation of a plasma, for example, while they are connected to a power supply providing a voltage. The electron-emitting surfaces of a hollow cathode are considered, in combination, to be one electrode. Electrodes can be made from materials well-known to those of skill in the art, such as steel, stainless steel, copper, or aluminum. However, these materials must be carefully selected for each plasma-enhanced process, as different gasses may require different electrode materials to ignite and maintain a plasma during operation. It is also possible to improve the performance and/or durability of the electrodes by providing them with a coating.

For any plasma source of the present invention, the power density of the plasma is defined as being the power dissipated in the plasma generated at the electrode(s), with reference to the size of the plasma. In a linear hollow-cathode type plasma source, the "power density of the plasma" can be defined as the total power applied to the source, divided by the total length of the plasma.

The "linear meter of plasma", also referred to here as "total length of the plasma", is defined as the distance between the ends of the plasma generated by a pair of electrodes, in the direction transversal to the travelling direction of the fabric substrate to be coated. When the plasma source comprises more than one pair of electrodes, the total length of the plasma is defined as the sum of the distances between the ends of the plasmas generated by each pair of electrodes, in the direction transversal to the travelling direction of the fabric substrate to be coated. As may be well understood by any person skilled in the art, these linear hollow cathode sources are scalable in that their length may be adapted so as to span the width of the substrate to be treated. Plasma source lengths may for example be of several meters. It makes sense therefore to express flow rates and applied power in units dependent on the overall length of the plasma source, as for example doubling the length of a plasma source obviously requires doubling the applied power and flow rates.

As used herein, the following terms have the following meanings: "A", "an", and "the" as used herein refers to both singular and plural referents unless the context clearly dictates otherwise. By way of example, "a chamber" refers to one or more than one chamber.

"Comprise," "comprising," and "comprises" and "comprised of" as used herein are synonymous with "include", "including", "includes" or "contain", "containing", "contains" and are inclusive or open-ended terms that specifies the presence of what follows e.g. component and do not exclude or preclude the presence of additional, non-recited components, features, elements, members or steps, known in the art or disclosed therein.

The recitation of numerical ranges by endpoints includes all numbers and fractions subsumed within that range, as well as the recited endpoints.

The invention additionally relates to a process for the production of fluorinated polymer coating on fabric substrates comprising the stages consisting in:

a. providing a fabric substrate;
b. providing a first plasma source, of linear hollow-cathode type, comprising at least one pair of hollow-cathode plasma generating electrodes connected to an AC, DC or pulsed DC generator, for the deposition of said fluorinated polymer coating on the fabric substrate;
c. injecting a first plasma generating gas in the first plasma source's electrodes at a flow rate of between 500 and 2500 sccm per linear meter of plasma of the first plasma source;
d. applying a first electrical power to the first plasma source, so that the first power density of the plasma is between 0.5 kW and 15 kW per linear meter of plasma of the first plasma source;
e. injecting an monomer at a flow rate of between 20 and 1000 sccm per linear meter of plasma of the first plasma source, the precursor being injected into the plasma at least in between the electrodes of each electrode pair of the first plasma source with an inert carrier gas at a flow rate of 0 and 1000 sccm per linear meter of plasma of the first plasma source;

f. providing a second plasma source, of linear hollow-cathode type, comprising at least one pair of hollow-cathode plasma generating electrodes connected to an AC, DC or pulsed DC generator, for the surface activation of said substrate;

g. injecting a second plasma generating gas in the second plasma source's electrodes at a flow rate of between 500 and 4500 sccm per linear meter of plasma of the second plasma source;

h. supplying a second electrical power to the second plasma source, so that the second power density of the plasma is between 0.5 kW and 15 kW per linear meter of plasma of the second plasma source, and i. activating the fabric substrate's surface by exposing the fabric substrate to the plasma of the second plasma source, before depositing the fluorinated polymer coating on the fabric substrate's surface, by exposing the fabric substrate to the plasma of the second plasma source;

j. depositing a fluorinated polymer coating on the fabric substrate's surface by exposing the fabric substrate to the plasma of the first plasma source.

The second plasma source activates the surface of the fabric substrate and thereafter, the first plasma source then deposits the fluorinated polymer coating on the fabric substrate.

The inventors found that, by the use of the process, it is possible to obtain fluorinated polymer coatings on a variety of substrates. The resulting substrates show high water repellency and/or oil repellency.

In certain embodiments of the present invention, for depositing the fluorinated polymer coating, the first plasma generating gas/monomer molar ratio may be up to 70, Advantageously the first plasma generating gas/monomer molar ratio is at least 1, in particular comprised between 1 and 50, in particular comprised between 1 and 30; In particular comprised between 1.5 and 30, in particular comprised between 1.5 and 20.

For surface activation, in certain embodiments of the present invention, the fabric substrate may be in contact with the plasma during a time advantageously comprised between 4 and 10 s, advantageously comprised between 5 and 10 s, advantageously between 6 and 8 s.

The surface activation and fluorinated polymer coating deposition of the process of the present invention is preferably performed, for example in a vacuum chamber, at a pressure between 0.005 and 0.050 Torr, preferably between 0.007 and 0.040 Torr and more preferably between 0.010 and 0.030 Torr. Appropriate exhaust means are used to maintain the desired pressure during the process. Such exhaust means are well known in the art.

The second and first plasma sources are preferably each connected to an AC or pulsed DC generator, the frequencies of which are usually between 5 and 150 kHz, preferably between 5 and 100 kHz, or to a DC generator.

The second and/or first linear hollow-cathode plasma source used in the present invention may be operated one or more vacuum chambers. For example the second linear hollow-cathode plasma source may be operated in a second vacuum chamber and the first linear hollow-cathode plasma source may be operated in a first vacuum chamber. These vacuum chambers may be provided with hermetical doors for batch processing of substrates. Preferably these vacuum chambers are uninterruptedly connected so as to allow continuous movement between vacuum chambers. Further, these vacuum chamber may be arranged so that it makes it possible to have, next to one another, different sources having different deposition forms or surface treatments. In certain cases, these sources, which make possible different deposition forms, are flat or rotating cathodes for magnetron sputtering depositions. This vacuum chamber may in particular be combined with means to transport flexible substrates along these sources in a roll-to-roll manner.

Batch processing is particularly suited when treating three dimensional shaped substrates. Three dimensional substrates may be exposed to the plasma of the present invention by suitable movements, e.g. rotation and/or displacement, so as to uniformly treat the substrate surface.

According to certain embodiments of the present invention, the second and/or first linear hollow-cathode plasma source used in the present invention can be composed of a hollow cathode comprising, for example, of one or two or more pairs of electrodes connected to an AC or pulsed DC generator, into which the plasma generating gas is injected, in which discharge takes place, and from whose openings the generated plasma is expelled. Each electrode forms a linear cavity, connected to a pipe which makes it possible to introduce, into the cavity, a plasma generating gas which will be ionized by a discharge. The plasma generated by a linear hollow-cathode plasma source extends lengthwise over the width of the fabric substrate, or essentially in a perpendicular direction to the travelling direction of the fabric substrate.

The electrodes used in the hollow cathode type plasma sources of the present invention may be provided with inlets for supplying the plasma generating gasses and with outlets, for example in the shape of a slit, a row of holes or nozzles, or an array of holes or nozzles, for directing the generated plasma towards the fabric substrate.

According to certain embodiments of the present invention, the distance between the outlets of the electrodes of the plasma sources may be comprised between 5 cm and 15 cm, preferably between 7 cm and 12 cm, preferably between 8 cm and 10 cm. The inventors have found that at shorter distances, certain substrates, such as fabrics or polymer films, may be damaged, for example through ion bombardment. Larger distances may lead to reduced adherence and reduced water and/or oil repellency.

For surface activation, in certain embodiments of the present invention, the second plasma generating gas is generally $N_2$ or $O_2$ or an $O_2/N_2$ mixture. Alternately the second plasma generating gas may be $N_2O$. Alternately the second plasma generating gas may comprise Ar or an $Ar/O_2$ mixture or an $Ar/N_2$ mixture. In a preferred embodiment the second plasma generating gas comprises $N_2$ alone or in a mixture with another gas, generally higher water repellency is observed in this case than in the absence of $N_2$. In another preferred embodiment the second plasma generating gas is free of $O_2$, for example pure $N_2$, as this limits the risk of $O_2$ disturbing the following coating step. The frequency of the power generator is usually between 5 and 150 kHz, preferably between 5 and 100 kHz. In certain advantageous embodiments the second plasma generating gas is pure $N_2$.

For the deposition of the fluorinated polymer coating, the first plasma generating gas is advantageously Ar or He or an Ar/He mixture. In certain advantageous embodiments the atomic ratio He/Ar is comprised between 0.5 and 10, advantageously between 2 and 8, advantageously between 3 and 7, advantageously between 3.5 and 5.5. In these ratios plasma temperature is kept low and at the same time plasma source life time is high.

The frequency of the power generator is usually between 5 and 150 kHz, preferably between 5 and 100 kHz. The monomer gas is injected uniformly along the first plasma source at least in between the electrodes of each electrode pair.

When the first plasma source comprises more than one pair of electrodes the monomer gas may additionally be injected in between each pair of electrodes towards the plasma that is present in between the outlets of the pair of electrodes of the plasma source, in the space between the fabric substrate and the plasma source. In each case the total flow is evenly distributed between all injection points.

The monomer gas is activated by the first plasma source's plasma. The fabric substrate is taken close to the source and a thin fluorinated polymer coating is deposited on the fabric substrate from the activated gas.

The flow rates of the ionizable plasma generating gas introduced into the electrode cavities may be controlled by mass flowmeters which are placed on the pipes between the gas reservoir and the plasma source. The flow rates of precursor gases injected into the plasma may be controlled by mass flowmeters. The working pressure range for the second and first plasma source is usually between 5 and 50 mTorr. Pumping for maintaining the vacuum is preferably provided by turbomolecular pumps, connected to the vacuum chamber. The pumping may be provided on the same side of the fabric substrate, or its travelling path, as the plasma sources and adjacent to the plasma sources. In addition pumping may be provided on the side opposite. In order to obtain good uniformity of the deposition on the fabric substrate, pumping is configured so as to evenly pump over the width of the fabric substrate. The width of the fabric substrate being the direction perpendicular to the travelling direction of the fabric substrate.

In an embodiment of the present invention, the production of a fluorinated polymer coating comprises plasma polymerization of a monomer precursor which is introduced into the plasma of a hollow cathode type plasma source, said monomer comprising fluorine. The precursor gases are preferably evenly distributed and injected in between the electrodes of each electrode pair and optionally also between the pairs of electrodes when more than on electrode pair is used.

In an embodiment of the present invention, the production of a fluorinated polymer coating comprises plasma polymerization of a fluorinated monomer precursor which is introduced into the plasma of a hollow cathode type plasma source, said monomer being of the general Formula (I):

a. 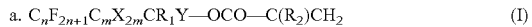 $C_nF_{2n+1}C_mX_{2m}CR_1Y\text{—}OCO\text{—}C(R_2)CH_2$     (I)

wherein n is 2 to 6, m is 0 to 9, X and Y are H, F, Cl, Br or I, $R_1$ is H or alkyl or a substituted alkyl, e.g. an at least partially halo-substituted alkyl, and $R_2$ is H or alkyl or a substituted alkyl, e.g. an at least partially halo-substituted alkyl.

The monomer of Formula I may be one containing six methyl groups. Aptly the monomer of Formula I is 1H,1H,2H,2H-Perfluorooctyl acrylate. Aptly the monomer of Formula I is 1H,1H,2H,2H-Perfluorooctyl methacrylate Preferably, the liquid monomer is transported to the plasma source without the use of a carrier gas. However, in some embodiments, an additional gas may be used as carrier gas to introduce the fluorinated precursor monomer into the plasma chamber.

Preferably the fluorinated monomer precursor is supplied as a liquid or solid monomer which is subsequently vaporized and transported to the plasma source in its vaporized form. Preferably the vaporized monomer is transported to the plasma chamber without the use of a carrier gas. Alternatively, if necessary, the fluorinated monomer supply system uses a carrier gas to transport the vaporized monomer precursor into the plasma chamber.

Preferably, when a carrier gas is used, the carrier gas is an inert gas, for example selected from He or Ar, and/or any mixture of these gases. In one preferred process, a single carrier gas is used. This is most preferably He or Ar, even more preferably He.

Preferably, when a carrier gas is used, the flow rate is between 100 and 1000 sccm per linear meter of plasma. Advantageously the carrier gas flow rate is at least 200 sccm, more advantageously at least 300 sccm, even more advantageously at least 300 sccm per linear meter of plasma source. Advantageously the carrier gas flow rate is at most 900 sccm, more advantageously at most 800 sccm, even more advantageously at most 700 sccm per linear meter of plasma source.

Preferably, when a carrier gas is used, the amount of carrier gas is about 5% to about 1500% carrier gas based on the flow of monomer, preferably about 25% to about 1500% additional gas, more preferably 50% to 1300%, for example 75% to 1300%.

Any precursor gases may be gaseous at room temperature and pressure, or may be vaporized liquids or solids.

The flow rate of the monomer is between 20 and 1000 sccm (standard cubic centimeters per minute) per linear meter of the plasma, preferably between 30 and 500 sccm or alternately between 50 and 300 sccm per linear meter of the plasma. This range is necessary in order to obtain high dynamic deposition rates, in the order of 10 to 200 nm·m/min. Generally higher fluorinated monomer flow rates require higher power applied to the plasma source. Standard cubic centimeters per minute (sccm) is a unit of flow measurement indicating cubic centimeters per minute ($cm^3$/min) in standard conditions for temperature and pressure of a given fluid. These standard conditions are for the present invention fixed at a temperature of 0° C. (273.15 K) and a pressure of 1.01 bar.

In certain embodiments of the invention, the ratio of the first plasma generating gas flow rate to the monomer flow rate is at least 1, advantageously between 1 and 40, more advantageously between 1 and 20, more advantageously between 1 and 20.

According to an embodiment of the present invention the temperature to which the fabric substrate is brought is between 20° C. and 40° C. With the process of the present invention this temperature may maintained in the absence of cooling means in contact with the fabric substrate during surface activation and deposition of the fluorinated polymer coating. The hollow cathode plasma sources used are configured for coating and activating the fabric substrates in post-discharge manner. Together with the applied power range and plasma generating gas types and flow rates substrate temperatures can be controlled.

According to the present in invention, the fabric substrate essentially consists of a fabric. This does however not exclude that fabric substrate is affixed temporarily or permanently to a suitable carrier material.

The fabric substrate may be selected among any of the embodiments below.

The fabric substrate may be selected among textiles based on one or more of the following fibrous materials or fibers: synthetic fibers, for example Polyester, Polyethylene, Polypropylene, or Aram id, natural fibers, for example wool, cotton, silk, or linen. The fabric substrate may be a woven or a non-woven textile.

Generally, in the present invention, the fabric substrate can include any textile, fabric material, fabric clothing, felt, or other fabric structure. The term "fabric" can be used to mean a textile, a cloth, a fabric material, fabric clothing, or another fabric product. The term "fabric structure" is intended to mean a structure having warp and weft that is woven, non-woven, knitted, tufted, crocheted, knotted, and/or pressured, for example. The terms "warp" and "weft" refer to weaving terms that have their ordinary means in the textile arts, as used herein, e.g., warp refers to lengthwise or longitudinal yarns on a loom, while weft refers to crosswise or transverse yarns on a loom.

Additionally, fabric substrates useful in the present invention can include fabric substrates that have fibers that can be natural and/or synthetic. It is notable that the term "fabric substrate" does not include materials commonly known as any kind of paper (even though paper can include multiple types of natural and synthetic fibers or mixture of both types of fibers). Furthermore, fabric substrates include both textiles in its filament form, in the form of fabric material, or even in the form of fabric that has been crafted into finished article (clothing, blankets, tablecloths, napkins, bedding material, curtains, carpet, shoes, etc.). In some examples, the fabric substrate has a woven, knitted, non-woven, or tufted fabric structure.

In an embodiment of the present invention the fabric substrate can be a woven fabric where warp yarns and weft yarns are mutually positioned at an angle of about 90°. This woven fabric can include, but is not limited to, fabric with a plain weave structure, fabric with a twill weave structure where the twill weave produces diagonal lines on a face of the fabric, or a satin weave. The fabric substrate can be a knitted fabric with a loop structure including one or both of warp-knit fabric and weft-knit fabric. The weft-knit fabric refers to loops of one row of fabric are formed from the same yarn. The warp-knit fabric refers to every loop in the fabric structure that is formed from a separate yarn mainly introduced in a longitudinal fabric direction. The fabric substrate can also be a non-woven product, for example a flexible fabric that includes a plurality of fibers or filaments that are bonded together and/or interlocked together by a chemical treatment process (e.g. a solvent treatment), a mechanical treatment process (e.g. embossing), a thermal treatment process, or a combination of two or more of these processes.

In an embodiment of the present invention the fabric substrate can include one or both of natural fibers and synthetic fibers. Natural fibers that can be used include, but are not limited to, wool, cotton, silk, linen, jute, flax or hemp. Additional fibers that can be used include, but are not limited to, rayon fibers, or those of thermoplastic aliphatic polymeric fibers derived from renewable resources, including, but not limited to, corn starch, tapioca products, or sugarcanes. These additional fibers can be referred to as "natural" fibers. In some examples, the fibers used in the fabric substrate includes a combination of two or more from the above-listed natural fibers, a combination of any of the above-listed natural fibers with another natural fiber or with synthetic fiber, a mixture of two or more from the above-listed natural fibers, or a mixture of any thereof with another natural fiber or with synthetic fiber.

In an embodiment of the present invention the synthetic fibers that can be used in the fabric substrate can include polymeric fibers such as, but not limited to, polyvinyl chloride (PVC) fibers, polyvinyl chloride (PVC)-free fibers made of polyester, polyamide, polyimide, polyacrylic, polyacrylonitrile, polypropylene, polyethylene, polyurethane, polystyrene, polyaramid, e.g. para-aramid known as Kevlar® for example, (trademark of E. I. du Pont de Nemours and Company), fiberglass, poly(trimethylene terephthalate), polycarbonate, polyester terephthalate, polyethylene or polybutylene terephthalate. In some examples, the fiber used in the fabric substrate can include a combination of two or more fiber materials, a combination of a synthetic fiber with another synthetic fiber or natural fiber, a mixture of two or more synthetic fibers, or a mixture of synthetic fibers with another synthetic or natural fiber. In some examples, the fabric substrate is a synthetic polyester fiber or a fabric made from synthetic polyester fibres.

In an embodiment of the present invention the fabric substrate can include both natural fibers and synthetic fibers. In some examples, the amount of synthetic fibers represents from about 20 wt % to about 90 wt % of the total amount of fibers. In some other examples, the amount of natural fibers represents from about 10 wt % to about 80 wt % of the total amount of fibers. In some other examples, the fabric substrate includes natural fibers and synthetic fibers in a woven structure, the amount of natural fibers is about 10 wt % of a total fiber amount and the amount of synthetic fibers is about 90 wt % of the total fiber amount. In some examples, the fabric substrate can also include additives such as, but not limited to, one or more of colorant (e.g., pigments, dyes, tints), antistatic agents, brightening agents, nucleating agents, antioxidants, UV stabilizers, fillers, lubricants, and combinations thereof.

In an embodiment of the present invention the fabric substrate is selected among textiles based on synthetic fibers.

Very advantageously the fabric substrate is selected among: Polyester based substrates.

The fabric substrate may also be a finished garment.

In certain advantageous embodiments, the second and/or first plasma sources of hollow cathode type of the present invention has dimensions of between 250 mm and 4000 mm in length and between 100 and 800 mm in width, providing a power of between 0.5 kW and 15 kW per linear meter of the plasma.

In each plasma source of the present invention, the power density is applied between any two electrodes of an electrode pair so that the power density is between 0.5 and 15 kW per linear meter of plasma, preferably between 0.7 and 10 kW per linear meter of plasma. The power density is generally adapted together with the fluorinated monomer flow rate. Below this power density of 0.5 kW per meter of plasma, deposition rate is low and coating adhesion is insufficient and, above 15 kW per meter of plasma, indeed even sometimes above 10 kW per m of plasma, too high degree of fragmentation of the fluorinated monomer occurs, and the resulting coating not sufficiently water repellent.

The coatings are generally manufactured so that their geometric thickness is at least 50 nm, even at least 60 nm, even at least 70 nm to make the fabric water repellent. At a thickness of at least 100 nm, even at least 300 nm, even at least 400 nm water repellency after washing is improved. Thicknesses may be up to 500 nm, even 600 nm, even 700 nm, even 800 nm, even 1000 nm or 1500 nm to limit processing time for fast process. In embodiments of the present invention the thickness may preferably be between 20 and 800 nm, in particular between 30 and 600 nm. The chosen thickness depends on the technical effect desired for the fabric substrates thus coated. Optimum thicknesses need to be adapted for every fabric having different surface roughness and porosity. The coating thicknesses are determined by depositing the fluorinated polymer coating under the same conditions on a flat substrate such as a polymer film, metal sheet or a glass sheet.

The fabric substrates may have a thickness comprised between 12 µm and 10 mm, preferably between 15 µm and 5 mm and more preferably between 25 µm and 2 mm.

The present invention further concerns a fabric substrate obtained by any one or more process embodiments described hereinabove.

The present invention further concerns a vacuum enclosure, such as for example a roll-to-roll vacuum coating enclosure, comprising first and/or second hollow cathode type plasma sources for carrying out the process of the present invention. In an alternate example the vacuum enclosure may be a horizontal or vertical vacuum coating line.

Figure 2:
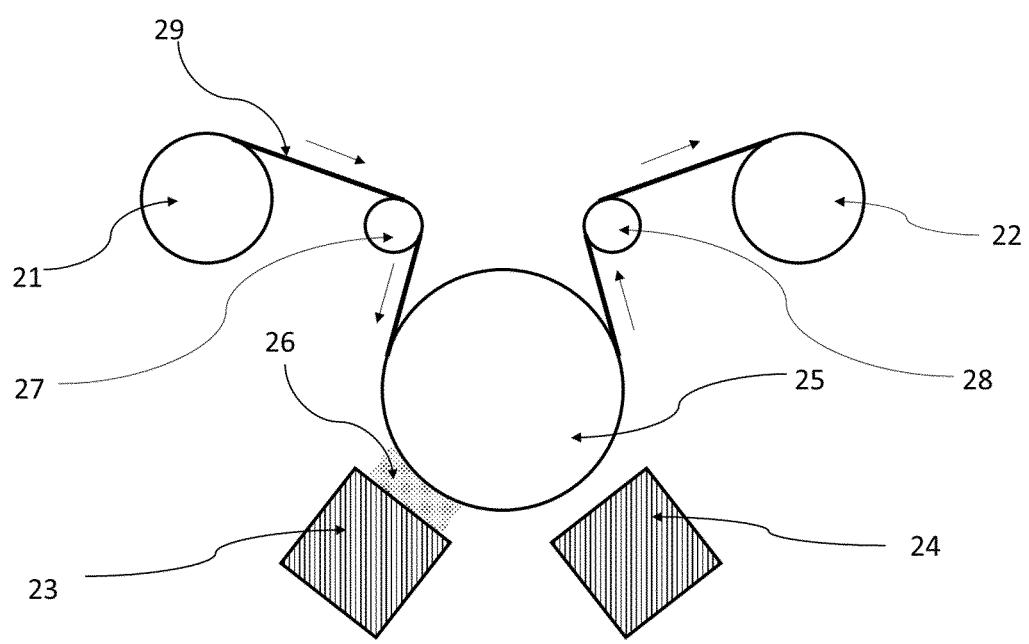
FIG. 2 shows a cross section of a roll-to-roll coating device for performing the process of the present invention.

The fabric substrate may be processed in a roll-to-roll manner, as shown for example in FIG. 2. In FIG. 2, the fabric substrate (29) is unwound from unwind roll (21) redirected over roll (27) towards main roll (25) where the coating process of the present invention takes place. The fabric substrate is then directed over roll (28) to be wound onto rewind roll (22). The coating process of the present invention is performed using the plasma source (23) which generates a plasma (26) at the surface of the polymer substrate whereby the fabric surface is activated and/or the fluorinated monomer is polymerized so as to form fluorinated polymer coating on the fabric substrate. The arrows in FIG. 2 indicate the moving direction of the fabric substrate. The direction of the film may be reversed so as to repeat the coating process with the fabric substrate moving in the opposite direction from before. Additional surface treatment or coating devices (24), for instance an additional plasma source, or a magnetron sputtering source, may be placed in the vicinity of the plasma source (23). In the scope of the present invention for example one plasma source may be used for surface activation while the other may be used for coating with a fluorinated polymer coating. Alternately one or both plasma sources may be used first for activating the substrate surface and then one or both plasma sources may be used for depositing a fluorinated polymer coating on the fabric substrate.

The roll-to-roll process is adapted to essentially flat fabric substrates. The person skilled in the art will obviously understand that a roll-to-roll process is not adapted for every fabric substrate. For example, certain fabric substrates that have been crafted into finished articles and that are not adapted to roll-to-roll, processing may be treated with the process of the present invention for example in conveyor-type process or any other way efficient to expose the substrate to the plasma. Flat fabric substrates may of course also be treated on a conveyor.

In an advantageous embodiment the first and/or second hollow cathode type plasma sources for carrying out the process of the present invention of the present invention, are placed below the fabric substrate being treated, which moves horizontally. The fabric surface may then be treated in an upwards fashion. Alternately the first and/or second hollow cathode type plasma sources for carrying out the process of the present invention of the present invention, are placed vertically, in proximity to the fabric substrate being treated, which moves vertically. The fabric surface may then be treated in an sideward fashion. These dispositions reduce the risk of coating defects for example due to powder or coater debris falling on the fabric surface.

In an embodiment of the present invention an airlock chamber is provided for introducing and extracting the fabric substrate into/out of a vacuum chamber where the process of the present invention is performed. In the airlock the substrate is brought from atmospheric pressure to the process vacuum level and if necessary degassed.

To coat textiles and fabrics on rolls (2D), the roll of fabric may be degassed to a degassing level of at most 6.7 Pa (50 mTorr), more preferably at most 5.3 Pa (40 mTorr), even more preferably at most 3.3 Pa (25 mTorr). Additionally or alternatively, said roll of fabric is degassed in a vacuum chamber until said vacuum chamber comprises a degassing level of at most 13.3 Pa (100 mTorr), more preferably at most 6.7 Pa (50 mTorr), such as 5.3 Pa (40 mTorr) or less. Note that the degassing level of the vacuum chamber may depend on the load, i.e. on the fabric structure, polymer, thickness, and openness, and on the roll dimensions of the roll of fabric placed inside the chamber.

In order to determine the degassing level of a finished fabric (3D) or a roll of fabric (2D), the pressure increase in a vacuum chamber due to gases released from the textile needs to be determined. Thereto, the item is positioned in a vacuum chamber, e.g. a plasma chamber, which is pumped down to a degassing pressure $P_{degassing}$, which is less than 26.7 Pa (200 mTorr), preferably less than 13.3 Pa (100 mTorr), such as less than 6.7 Pa (50 mTorr), and next the inlets and outlets of the vacuum chamber are closed off. After a preset time of 60 seconds, the pressure increase, $\Delta P$, inside the chamber is measured. The degassing level of the textile is then given by the pressure increase, $\Delta P$, minus the whistling leak pressure of the vacuum chamber at the degassing pressure $P_{degassing}$. Optionally, if more than one finished textile product (3D) is positioned inside the vacuum chamber, the degassing level of one textile product is given by the pressure increase, $\Delta P$, minus the whistling leak pressure of the vacuum chamber at the degassing pressure $P_{degassing}$, divided by the number of substrates in the vacuum chamber. Hereby, the whistling leak pressure of the vacuum chamber at the degassing pressure degassing P is determined by repeating the same procedure for an empty chamber with all electronic substrates removed from the vacuum chamber—pumping down to the same degassing pressure $P_{degassing}$, closing off all inlets and outlets of the vacuum chamber and measuring the pressure increase after the same preset time as for the loaded chamber, i.e. 60 seconds.

In a preferred embodiment the degassing and the surface activation are combined in a single processing step.

The present invention in certain embodiments concerns the following items:

Item 1. Process for the production of fluorinated polymer coatings on fabric substrates comprising the stages consisting in:
a. providing a fabric substrate;
b. providing a first plasma source, of linear hollow-cathode type, comprising at least one pair of hollow-cathode plasma generating electrodes connected to an AC, DC or pulsed DC generator, for the deposition of said water repellent coating on the fabric substrate;
c. injecting a first plasma generating gas in the first plasma source's electrodes at a flow rate of between 500 and 2500 sccm per linear meter of plasma of the first plasma source;
d. applying a first electrical power to the first plasma source, so that the first power density of the plasma is between 0.5 kW and 15 kW per linear meter of plasma the first plasma source;
e. injecting an fluorinated monomer at a flow rate of between 20 and 1000 sccm per linear meter of plasma of the first plasma source, the monomer being injected into the plasma in at least between the electrodes of each electrode pair of the first plasma source; with an inert carrier gas at a flow rate of 0 and 1000 sccm per linear meter of plasma of the first plasma source; preferably the flow rate of the fluorinated monomer is between 150 and 600 sccm alternately between 200 and 500 sccm per linear meter of the plasma f. depositing a water repellent coating on the fabric substrate's surface by exposing the fabric substrate to the plasma of the first plasma source.

Item 2. Process according to item 1, further comprising the stages consisting in:

a. providing a second plasma source, of linear hollow-cathode type, comprising at least one pair of hollow-cathode plasma generating electrodes connected to an AC, DC or pulsed DC generator, for the surface activation of said fabric substrate;

b. injecting a second plasma generating gas in the second plasma source's electrodes at a flow rate of between 500 and 4500 sccm per linear meter of the second plasma source;

c. supplying a second electrical power to the second plasma source, so that the second power density of the plasma is between 0.5 kW and 15 kW per linear meter of plasma of the second plasma source, and d. activating the fabric substrate's surface by exposing the fabric substrate to the plasma of the second plasma source, before depositing the water repellent coating on the fabric substrate's surface by exposing the fabric substrate to the plasma of the second plasma source.

Item 3. Process according to any one preceding item, characterized in that the fluorinated monomer is of the formula:

a. 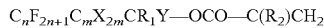
$C_nF_{2n+1}C_mX_{2m}CR_1Y-OCO-C(R_2)CH_2$ wherein n is 2 to 6, m is 0 to 9, X and Y are H, F, Cl, Br or I, $R_1$ is H or alkyl or a substituted alkyl, e.g. an at least partially halo-substituted alkyl, and $R_2$ is H or alkyl or a substituted alkyl, e.g. an at least partially halo-substituted alkyl, preferably the fluorinated monomer is 1H,1H,2H,2H-Perfluorooctyl acrylate or 1H,1H,2H,2H-Perfluorooctyl methacrylate.

Item 4. Process according to any one preceding item further comprising outgassing of the fabric substrate, preferably simultaneously with activating the fabric substrate's surface.

Item 5. Process according to any one preceding item wherein the fabric substrate is a fabric on a roll, treated in a roll-to-roll process.

Item 6. Process according to any one preceding item, characterized in that the second plasma generating gas comprises $N_2$, $O_2$, or a mixture of $O_2$ and $N_2$, or $N_2O$.

Item 7. Process according to any one preceding item, characterized in that the first plasma generating gas comprises He, Ar or a mixture of He and Ar.

Item 8. Process according to any one preceding item, characterized in that the carrier gas comprises He, Ar or a mixture of He and Ar.

Item 9. Process according to any one preceding item, characterized in that the carrier gas flow rate the flow rate is between 100 and 1000 sccm per linear meter of plasma, advantageously at least 200 sccm, more advantageously at least 300 sccm, even more advantageously at least 300 sccm per linear meter of plasma source; advantageously the carrier gas flow rate is at most 900 sccm, more advantageously at most 800 sccm, even more advantageously at most 700 sccm per linear meter of plasma source.

Item 10. Process according to item 7, characterized in that the second plasma generating gas comprises a mixture of He and Ar with an atomic ratio He/Ar comprised between 0.5 and 10, advantageously between 2 and 8, advantageously between 3 and 7, advantageously between 3.5 and 5.5.

Item 11. Process according to any one of items 2 to 8, characterized in that the fabric substrate is exposed to the plasma of the second plasma source during a time advantageously comprised between 4 and 12 s, advantageously comprised between 5 and 10 s, advantageously between 6 and 8 s.

Item 12. Process according to any one preceding item, characterized in that the ratio of the first plasma generating gas flow rate to the fluorinated monomer flow rate is at least 1, advantageously between 1 and 20.

Item 13. Process according to any one preceding item, wherein the temperature of the fabric substrate is at most 40° C., advantageously in the absence of cooling means in contact with the fabric substrate during surface activation and deposition of the water repellent coating.

Item 14. Process according to any one preceding item wherein the surface activation and water repellent coating deposition of the process are preferably performed at a pressure between 0.005 and 0.050 Torr, preferably between 0.007 and 0.040 Torr and more preferably between 0.010 and 0.030 Torr.

Item 15. Process according to any of items 1 to 4 and 5 to 14, wherein the textile product is a three dimensional shaped finished textile product after confectioning, such as a garment or accessories, treated in a batch process.

It is to be understood that although preferred embodiments and/or materials have been discussed for providing embodiments according to the present invention, various modifications or changes may be made without departing from the scope and spirit of this invention. In particular any possible embodiments discussed herein may be combined.

The invention will be more readily understood by reference to the following examples, which are included merely for purpose of illustration of certain aspects and embodiments of the present invention and are not intended to limit the invention.

EXAMPLES

Water repellency was evaluated using the spray rating, according to standard ISO4920 (2012). It was evaluated after initial coating and after several wash cycles according to ISO6330 (2012) using the parameters of Table 1. Oil repellency was tested according to ISO14419.

TABLE 1

| | |
|---|---|
| Washing machine Type | A |
| Temperature | 40° C. |
| Washing Cycle duration | 45 minutes |
| Detergent | 20 g reference detergent 3 |
| Ballast load | 2 kg, Type III PES ballast |
| Drying | Line drying, at least 12 hours |
| Spinning | 1000 RPM |

For the water repellency evaluation, according to standard ISO4920 (2012). Water, distilled or fully deionized, at (20±2) °C. was used. Testing was performed at ambient temperature and the photographic spray rating scale was sued for rating the samples;

The thickness is advantageously evaluated on a soda lime glass substrate coated under identical conditions. On a glass substrate the thickness may be measured using a step profiler.

For the examples below plasma sources of hollow cathode type were used that comprise one pair of electrodes. The plasma sources were incorporated in a vacuum chamber. Flow rates indicated with the units sccm/m are flowrates in sccm per linear meter of plasma. Plasma generating gases are evenly distributed among each electrode. As the plasma sources comprise only one pair of electrodes, the fluorinated monomer and its carrier gas are evenly distributed and injected in between the electrodes of the electrode pair.

Scanning Electron Microscope analysis of the substrates shows that the examples according to the invention present no fiber damage, such as melting or etching or burning.

The fabric substrates were 20×30 cm 2 sheets of fabric transported at continuous speed below the plasma sources on a glass carrier by conveyor so as to be brought into contact with the plasma sources.

The pressure in the vacuum chamber was kept at a pressure between 5 and 40 mTorr.

TABLE 2

Fabric Substrate

| Material | woven or non-woven | thickness | weight/m$^2$ |
|---|---|---|---|
| Polyester | Non-woven | 0.14-0.17 mm | 90-110 g/m$^2$ |

In the examples below, surface activation was performed with a second plasma source of linear hollow-cathode type, comprising at two pairs of hollow-cathode plasma generating electrodes connected to an AC, DC or pulsed DC generator, the second plasma generating gas, N$_2$, was injected into the second plasma source's electrodes at a total flow rate of 2000 sccm per linear meter of plasma of the second plasma source, the second power density was between 1 and 4.4 kW per linear meter of plasma. The fabric substrate was moved through the plasma at a speed of about 2.5 m/m in as many times as necessary to reach the indicated treatment time.

In the examples below, deposition of the water repellent coatings was performed using first plasma source of linear hollow-cathode type, comprising two pairs of hollow-cathode plasma generating electrodes connected to an AC, DC, or pulsed DC generator.

The first plasma generating gas, Ar was used at a total flow rate of 1500 sccm per linear meter of plasma of the first plasma source.

The fluorinated monomer, 1H, 1H, 2H, 2H-Perfluorooctyl acrylate (C6FA) was injected in between the electrodes of the electrode pair of the first plasma source, so as to deposit a fluorinated polymer coating on the activated fabric substrate surface. The fabric substrate was moved continuously through the plasma at a speed of about 2.5 m/min as many times as necessary to reach the indicated coating thickness. The thicknesses indicated in the table below are the thicknesses obtained under identical conditions on a glass substrate, as it is not possible to measure coating thicknesses reliably on most fabric substrates.

With a monomer precursor flow rate of 70 sccm/m and a He carrier gas flow rate for the monomer of 750 sccm/m and an argon plasma generating gas flow rate of 1500 sccm/m a coating thickness of 80 nm was obtained. Flow rates are expressed per linear meter of plasma as explained hereinabove.

The resulting coating had a water repellency rating of at least 3.5. Oil repellency rating was 4.0 initially as well as up to the fourth washing cycle included. After 5 washing cycles oil repellency dropped to 3.5, after 6 washing cycles oil repellency dropped to 3.0.

The invention claimed is:

1. A process for producing a fluorinated polymer coating on a fabric substrate, comprising:
   providing the fabric substrate;
   providing a first plasma source for deposition of the fluorinated polymer coating on the fabric substrate, wherein the first plasma source is a linear hollow-cathode, comprising at least one pair of hollow-cathode plasma generating electrodes connected to an AC, DC or pulsed DC generator;
   injecting a first plasma generating gas in the at least one pair of hollow-cathode plasma generating electrodes at a flow rate of between 500 and 2500 sccm per linear meter of the first plasma source;
   applying a first electrical power to the first plasma source, so that a first power density of the plasma is between 0.5 kW and 15 KW per linear meter of the first plasma source;
   injecting a fluorinated monomer at a flow rate of between 20 and 1000 sccm per linear meter of the first plasma source with an inert carrier gas at a flow rate of 0 and 1000 sccm per linear meter of the first plasma source, wherein the fluorinated monomer is injected into the plasma between the at least one pair of hollow-cathode plasma generating electrodes of the first plasma source; and
   depositing the fluorinated polymer coating on a surface of the fabric substrate by exposing the fabric substrate to the plasma of the first plasma source, wherein the fluorinated polymer coating is water repellent.

2. The process according to claim 1, further comprising:
   providing a second plasma source for a surface activation of said fabric substrate, wherein the second plasma source is a linear hollow-cathode, comprising at least one pair of hollow-cathode plasma generating electrodes connected to an AC, DC or pulsed DC generator;
   injecting a second plasma generating gas in the at least one pair of hollow-cathode plasma generating electrodes of the second plasma source at a flow rate of between 1500 and 4500 sccm per linear meter of the second plasma source;
   supplying a second electrical power to the second plasma source, so that a second power density of the plasma is between 0.5 kW and 15 KW per linear meter of the second plasma source; and
   activating the surface of the fabric substrate by exposing the fabric substrate to the plasma of the second plasma source, before depositing the fluorinated polymer coating on the surface.

3. The process according to claim 1, wherein the fluorinated monomer is of the formula:

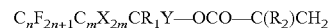

wherein n is 2 to 6, m is 0 to 9, X and Y are H, F, Cl, Br or I, R$_1$ is H, alkyl, or a substituted alkyl, and R$_2$ is H, alkyl or a substituted alkyl.

4. The process according to claim 2, further comprising outgassing of the fabric substrate, before or simultaneously with activating the surface.

5. The process according to claim 1, wherein the fabric substrate is a fabric on a roll, treated in a roll-to-roll process.

6. The process according to claim 2, wherein the second plasma generating gas comprises $N_2$, $O_2$, a mixture of $O_2$ and $N_2$, or $N_2O$.

7. The process according to claim 1, wherein the first plasma generating gas comprises He, Ar, or a mixture of He and Ar.

8. The process according to claim 7, wherein the first plasma generating gas comprises the mixture of He and Ar with an atomic ratio He/Ar between 0.5 and 10.

9. The process according to claim 2, wherein the fabric substrate is exposed to the plasma of the second plasma source during a time between 4 and 12 s.

10. The process according to claim 1, wherein a ratio of the first plasma generating gas flow rate to the fluorinated monomer flow rate is at least 1.

11. The process according to claim 2, wherein a temperature of the fabric substrate is at most 40° C.

12. The process according to claim 2, wherein the surface activation and fluorinated polymer coating deposition are performed at a pressure between 0.005 and 0.050 Torr.

13. The process according to claim 7, wherein the first plasma generating gas comprises the mixture of He and Ar with an atomic ratio He/Ar between 3.5 and 5.5.

14. The process according to claim 1, wherein a ratio of the first plasma generating gas flow rate to the fluorinated monomer flow rate is between 1 and 20.

15. The process according to claim 2, wherein a temperature of the fabric substrate is at most 40° C. and there is no cooling means in contact with the fabric substrate during surface activation and deposition of the fluorinated polymer coating.

16. The process according to claim 2, wherein the surface activation and fluorinated polymer coating deposition are performed at a pressure between 0.010 and 0.030 Torr.

* * * * *